(12) United States Patent
DeSimone

(10) Patent No.: US 9,865,315 B1
(45) Date of Patent: Jan. 9, 2018

(54) COMPENSATION OF DETERMINISTIC CROSSTALK IN MEMORY SYSTEM

(71) Applicant: Integrated Device Technology, Inc., San Jose, CA (US)

(72) Inventor: Craig DeSimone, Dacula, GA (US)

(73) Assignee: INTEGRATED DEVICE TECHNOLOGY, INC., San Jose, CA (US)

(*) Notice: Subject to any disclaimer, the term of this patent is extended or adjusted under 35 U.S.C. 154(b) by 0 days.

(21) Appl. No.: 15/367,672

(22) Filed: Dec. 2, 2016

Related U.S. Application Data

(60) Provisional application No. 62/372,407, filed on Aug. 9, 2016, provisional application No. 62/263,596, filed on Dec. 4, 2015.

(51) Int. Cl.
*G11C 7/10* (2006.01)
*G11C 7/22* (2006.01)

(52) U.S. Cl.
CPC ............... *G11C 7/222* (2013.01); *G11C 7/10* (2013.01)

(58) Field of Classification Search
CPC ......... G11C 16/14; G11C 16/10; G11C 7/222; G11C 7/10

USPC ............... 365/189.05, 129, 189.011, 189.15, 365/189.17, 189.07, 189.08, 191, 193, 365/194, 206, 210.11, 230.01, 230.06, 365/233.1, 233.11, 233.14, 233.17, 365/233.16

See application file for complete search history.

(56) References Cited

U.S. PATENT DOCUMENTS

| | | | |
|---|---|---|---|
| 2006/0140045 A1* | 6/2006 | Kishimoto | G11C 7/1051 365/189.05 |
| 2016/0148663 A1* | 5/2016 | Tokuhiro | G11C 7/1093 365/189.07 |

* cited by examiner

*Primary Examiner* — Fernando Hidalgo
(74) *Attorney, Agent, or Firm* — Christopher P. Maiorana, PC

(57) ABSTRACT

An apparatus includes a detector circuit and a receiver circuit. The detector circuit may be configured to (i) identify a start of a command sequence associated with a directed access to a memory system and (ii) generate a control signal indicating a non-consecutive clock associated with the start of the command sequence. The receiver circuit may be configured to initialize an equalizer circuit configured to compensate for deterministic crosstalk coupled between a data line and a data strobe line to provide an increased margin.

20 Claims, 8 Drawing Sheets

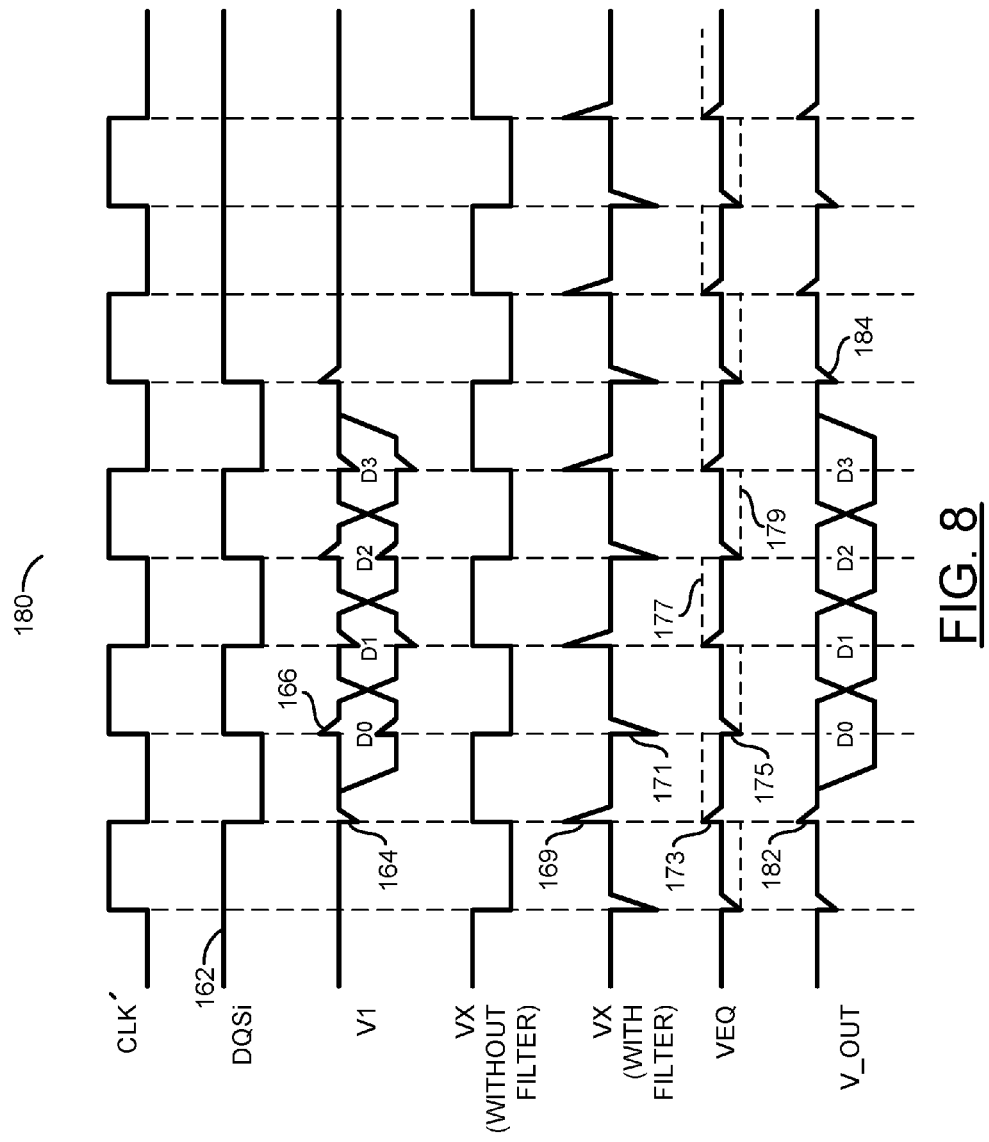

COMPENSATION OF DETERMINISTIC CROSSTALK IN MEMORY SYSTEM

This application relates to U.S. Provisional Application No. 62/263,596, filed Dec. 4, 2015, and U.S. Provisional Application No. 62/372,407, filed Aug. 9, 2016, each of which are hereby incorporated by reference in their entirety.

FIELD OF THE INVENTION

The present invention relates to digital receivers generally and, more particularly, to a method and/or apparatus for compensation of deterministic crosstalk in a memory system.

BACKGROUND

In memory applications, coupling between data DQ lines and data strobe DQS lines can result in deterministic crosstalk that degrades performance at a receiving end of the DQ lines. When running at double-data rates, equalization circuitry at the receiving end of the DQ lines operates on data in the DQ lines based on both edges of strobe signals in the DQS lines. The crosstalk on the rising edges of the signals in the DQS lines is different from the crosstalk on the falling edges making removal of the crosstalk difficult.

It would be desirable to implement a method and/or apparatus for compensation of deterministic crosstalk in a memory system.

SUMMARY

The present invention concerns an apparatus including a detector circuit and a receiver circuit. The detector circuit may be configured to (i) identify a start of a command sequence associated with a directed access to a memory system and (ii) generate a control signal indicating a non-consecutive clock associated with the start of the command sequence. The receiver circuit may be configured to initialize an equalizer circuit configured to compensate for deterministic crosstalk coupled between a data line and a data strobe line to provide an increased margin.

BRIEF DESCRIPTION OF THE FIGURES

Embodiments of the invention will be apparent from the following detailed description and the appended claims and drawings in which:

FIG. 8 is another set of waveforms corresponding to FIG. 7.

DETAILED DESCRIPTION OF THE EMBODIMENTS

Embodiments of the invention include providing a method and/or apparatus for compensation of deterministic crosstalk in a memory system that may (i) feedback burst signals positioned with rising and falling edges of a strobe signal into a data signal for compensation of the crosstalk, (ii) control an equalizer in a data buffer receiver to eliminate offsets due to the crosstalk, (iii) reset the equalizer in response to detection of a discontinuous clock, (iv) synchronize the equalizer with a local clock, and/or (v) be implemented as one or more integrated circuits.

Figure 3:
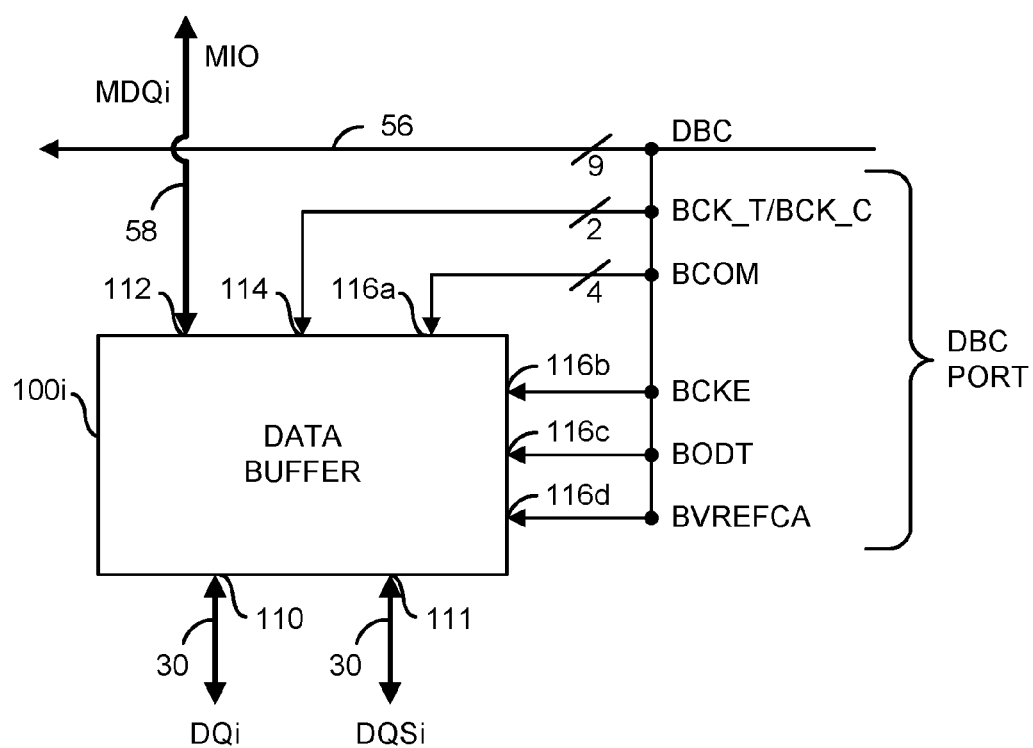
FIG. 3 is a block diagram illustrating input/output for a data buffer.
Figure 4:
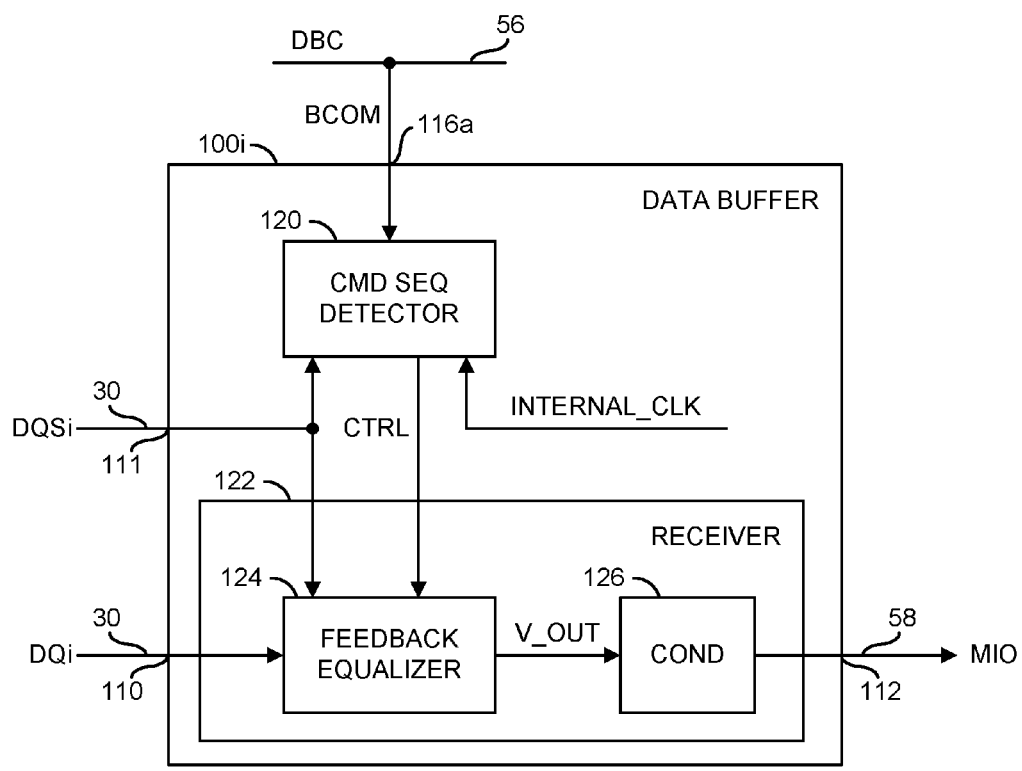
FIG. 4 is a diagram illustrating an equalizer in accordance with an embodiment of the invention.

In various embodiments, the invention generally includes providing a method and/or apparatus for compensation of deterministic crosstalk induced on a data signal. The memory system may implement a DDR4 pseudo open drain bus application. For example, in some embodiments, a feedback equalizer as illustrated in FIG. 4 may be implemented within a data buffer 100i in a memory system, as illustrated in FIG. 3. A detector or synchronization circuit may be configured to identify rising and falling edges of a data strobe signal that causes the crosstalk in the data signal. Once the temporal positions of the crosstalk are detected by the detector/synchronization circuit, in inverse crosstalk signal may be created, and added to the received data signal to cancel the actual crosstalk. In some embodiments, the inverse crosstalk may be considered a feedback of the crosstalk noise into the data signal.

Figure 1:
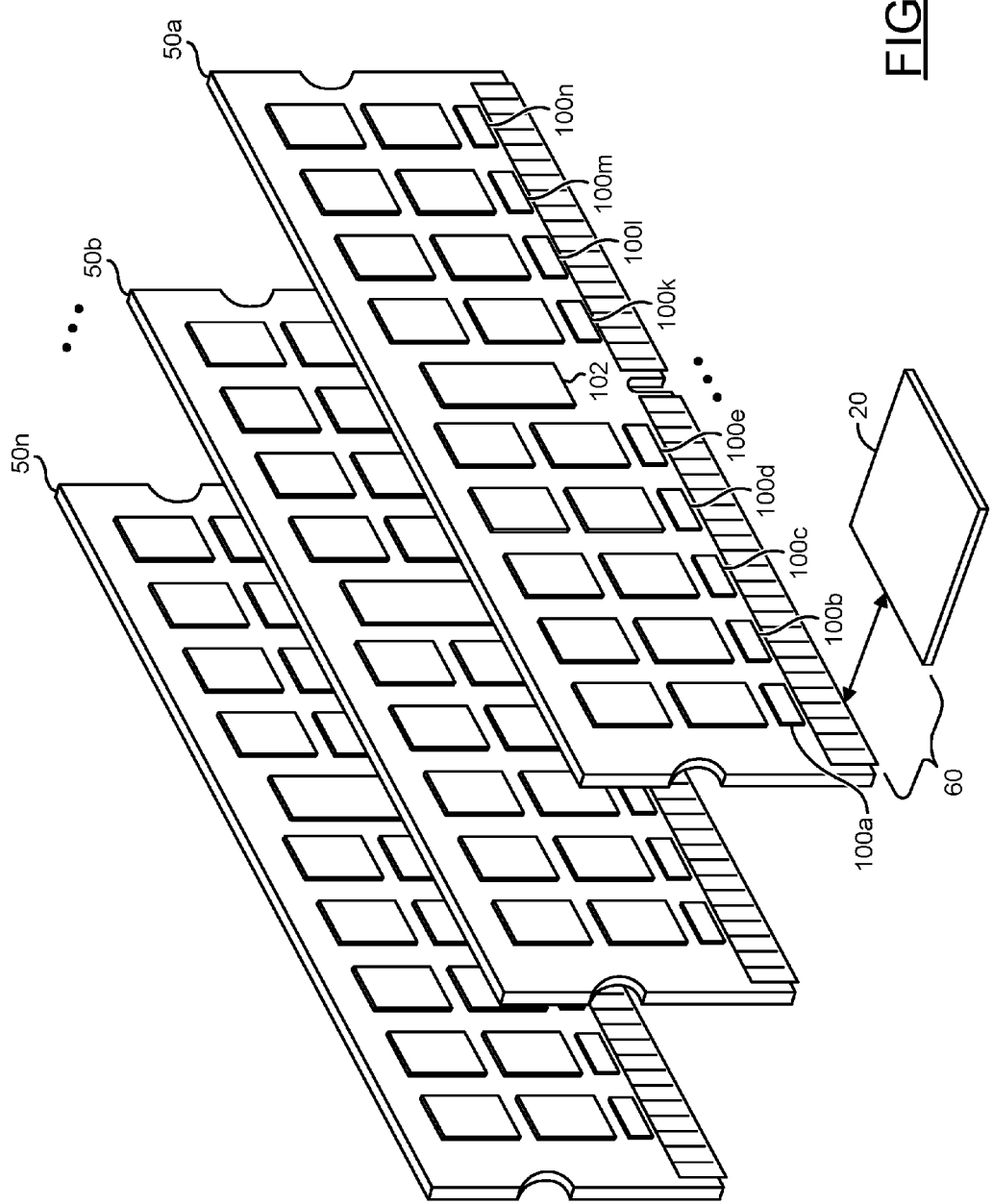
FIG. 1 is a diagram illustrating an example embodiment.

Referring to FIG. 1, a diagram of a memory system is shown in accordance with an embodiment of the present invention. In an example, circuits 50a-50n may be implemented as memory modules (or boards). For example, the memory modules 50a-50n may be implemented as dual in-line memory modules (DIMMs). In some embodiments, the memory modules 50a-50n may be implemented as double data rate fourth generation (DDR4) dual in-line memory modules (DIMMs). The memory modules 50a-50n may comprise a block (or circuit) 102, a number of blocks (or circuits) 100a-100n, a block (or circuit) 102, and/or various other blocks, circuits, pins, connectors and/or traces. The circuit 102 may be implemented as a registered clock driver (RCD). In an example, the RCD circuit 102 may be implemented as a DDR4 RCD circuit. The circuits 100a-100n may be configured as data buffers. The type, arrangement and/or number of components of the memory modules 50a-50n may be varied to meet the design criteria of a particular implementation.

The memory modules 50a-50n are shown connected to a block (or circuit) 20. The circuit 20 may implement a memory controller. The memory controller 20 may be located in another device, such as a computing engine. Various connectors/pins/traces 60 may be implemented to connect the memory modules 50a-50n to the memory controller 20. In some embodiments, the connectors/pins/traces 60 may comprise a 288-pin configuration. In an example, the memory controller 20 may be a component on a computer motherboard (or main board). In another example, the memory controller 20 may be a component of a microprocessor. In yet another example, the memory controller 20 may be a component of a central processing unit (CPU).

In an example, some of the connectors/pins/traces 60 may be part of the memory modules 50a-50n and some of the connectors/pins/traces 60 may be part of the motherboard and/or memory controller 20. The memory modules 50a-50n may be connected to a computer motherboard (e.g., by pins, traces and/or connectors 60) to transfer data between components of a computing device and the memory modules 50a-50n. In an example, the memory controller 20 may be implemented on a northbridge of a motherboard and/or as a component of a microprocessor (e.g., an Intel CPU, an AMD CPU, an ARM CPU, etc.). The implementation of the memory controller 20 may be varied according to the design criteria of a particular implementation.

In various embodiments, the memory modules 50a-50n may implement DDR4 SDRAM memory modules. In an example, the DDR4 SDRAM memory modules 50a-50n may have a memory module density of 512 gigabyte (GB), one terabyte (TB), or higher per module (e.g., compared with 128 GB per dual in-line memory module (DIMM) in DDR3). The DDR4 SDRAM memory modules 50a-50n may operate at voltages of 1.2-1.35 volts (V) with a frequency between 800-1600 megahertz (MHz) (e.g., compared with 1.5-1.65V at frequencies between 400-1067 MHz in DDR3). In some embodiments, the memory modules 50a-50n may be implemented as low voltage memory and operate at 1.05V. For example, the low voltage embodiments of the memory modules 50a-50n may implement 35% power savings compared with DDR3 memory. The DDR4 SDRAM memory modules 50a-50n may transfer data at speeds of 2.13-4.26 giga-transfers per second (GT/s) and higher (e.g., compared with 0.8-2.13 GT/s in DDR3). The operating parameters of the memory modules 50a-50n may be varied according to the design criteria of a particular implementation.

In an example, the memory modules 50a-50n may be compliant with the DDR4 specification titled "DDR4 SDRAM", specification JESD79-4A, November 2013, published by the Joint Electron Device Engineering Council (JEDEC) Solid State Technology Association, Arlington, Va. Appropriate sections of the DDR4 specification are hereby incorporated by reference in their entirety.

The memory modules 50a-50n may be implemented as DDR4 load reduced DIMMs (LRDIMMs). The data buffers 100a-100n may allow the memory modules 50a-50n in a DDR4 LRDIMM configuration to operate at higher bandwidths and/or at higher capacities compared with DDR4 RDIMM (e.g., 2400 or 2666 MT/s for DDR4 LRDIMM compared with 2133 or 2400 MT/s for DDR4 RDIMM at 384 GB capacity). For example, compared with DDR4 RDIMM configurations, the DDR4 LRDIMM configuration of the memory modules 50a-50n may allow improved signal integrity on data signals, and/or better intelligence and/or post-buffer awareness by the memory controller 20.

Figure 2:
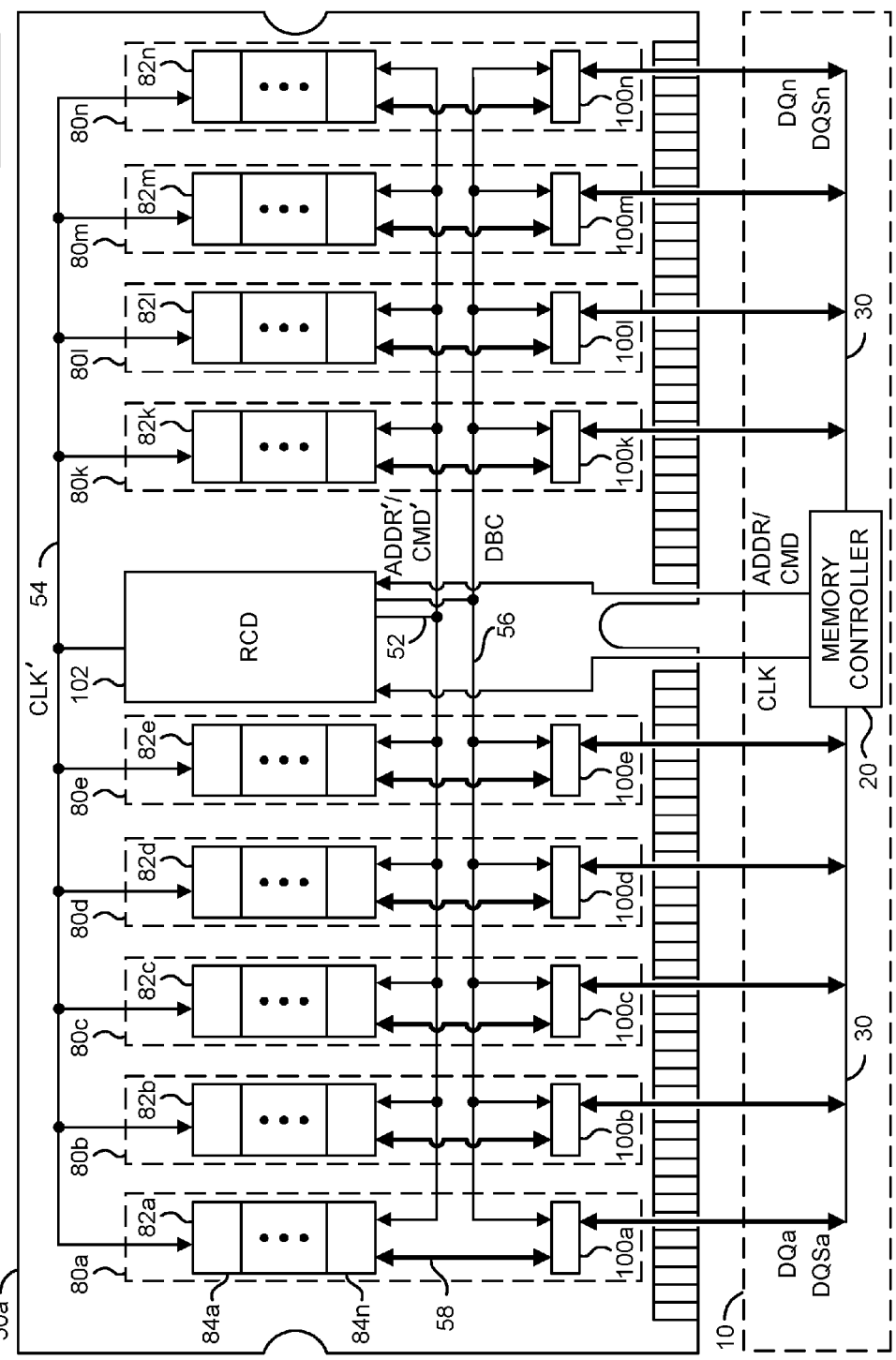
FIG. 2 is a block diagram illustrating a memory module.

Referring to FIG. 2, a block diagram 50a illustrating a memory module is shown. The memory module 50a may be representative of the memory modules 50b-50n. The memory module 50a is shown communicating with the memory controller 20. The memory controller 20 is shown as part of a block (or circuit) 10. The circuit 10 may be a motherboard, or other electronic component or computing engine that communicates with the memory module 50a.

The memory module 50a may comprise one or more blocks (or circuits) 80a-80n and/or the RCD circuit 102. The circuits 80a-80n may implement data paths of the memory module 50a. For example, the data path 80a may include the blocks 82a and/or the data buffer 100a. The data paths 80b-80n may have similar implementations. The circuits 82a-82n may each be implemented as a memory channel. Each of the memory channels 82a-82n may comprise a number of blocks (or circuits) 84a-84n. The circuits 84a-84n may be implemented as random access memory (RAM) chips. For example, the RAM chips 84a-84n may implement a volatile memory such as dynamic RAM (DRAM). In some embodiments, the RAM chips 84a-84n may be physically located on both sides (e.g., the front and back) of the circuit board of the memory modules 50a-50n. A capacity of memory on the memory module 50a may be varied according to the design criteria of a particular implementation.

The memory controller 20 may generate a signal (e.g., CLK) and a number of control signals (e.g., ADDR/CMD). The signal CLK and/or the signals ADDR/CMD may be presented to the RCD circuit 102. A data bus 30 may be connected between the memory controller and the data paths 80a-80n. The memory controller 20 may generate and/or receive data signals (e.g., DQa-DQn) and data strobe signals (e.g., DQSa-DQSn) that may be presented/received from the data bus 30. Portions of the signals DQa-DQn and DQSa-DQSn may be presented to respective data paths 80a-80n.

The RCD circuit 102 may be configured to communicate with the memory controller 20, the memory channels 82a-82n and/or the data buffers 100a-100n. The RCD circuit 102 may decode instructions received from the memory controller 20. For example, the RCD circuit 102 may receive register command words (RCWs). In another example, the RCD circuit 102 may receive buffer control words (BCWs). The RCD circuit 102 may be configured to train the DRAM chips 84a-84n, the data buffers 100a-100n and/or command and address lines between the memory controller 20. For example, the RCWs may flow from the memory controller 20 to the RCD circuit 102. The RCWs may be used to configure the RCD circuit 102.

The RCD circuit 102 may be used in both LRDIMM and RDIMM configurations. The RCD circuit 102 may implement a 32-bit 1:2 command/address register. The RCD circuit 102 may support an at-speed bus (e.g., a BCOM bus between the RCD circuit 102 and the data buffers 100a-100n). The RCD circuit 102 may implement automatic impedance calibration. The RCD circuit 102 may implement command/address parity checking. The RCD circuit 102 may control register RCW readback. The RCD circuit 102 may implement a 1 MHz inter-integrated circuit ($I^2C$) bus (e.g., a serial bus). Inputs to the RCD circuit 102 may be pseudo-differential using external and/or internal voltages. The clock outputs, command/address outputs, control outputs and/or data buffer control outputs of the RCD circuit 102 may be enabled in groups and independently driven with different strengths.

The RCD circuit 102 may receive the signal CLK and/or the signals ADDR/CMD from the memory controller 20. Various digital logic components of the RCD circuit 102 may be used to generate signals based on the signal CLK and/or the signals ADDR/CMD and/or other signals (e.g., RCWs). The RCD circuit 102 may also be configured to generate a signal (e.g., CLK') and signals (e.g., ADDR'/CMD'). For example, the signal CLK' may be a signal Y_CLK in the DDR4 specification. The signal CLK' and/or the signals ADDR'/CMD' may be presented to each of the memory channels 82a-82n. For example, the signals CLK' and/or ADDR'/CMD' may be transmitted on a common bus 54. The RCD circuit 102 may generate one or more signals (e.g., DBC). The signals DBC may implement data buffer control signals. The signals DBC may be presented to the data buffers 100a-100n. The signals DBC may be transmitted on a common bus 56 (e.g., a data buffer control bus).

The data buffers 100a-100n may be configured to receive data from the bus 56. The data buffers 100a-100n may be configured to generate/receive data to/from the bus 30. The bus 30 may comprise traces, pins and/or connections between the memory controller 20 and the data buffers 100a-100n. A bus 58 may carry the data between the data buffers 100a-100n and the memory channels 82a-82n. The data buffers 100a-100n may be configured to buffer data on the buses 30 and 58 for write operations (e.g., data transfers from the memory controller 20 to the corresponding memory channels 82a-82n). The data buffers 100a-100n may be configured to buffer data on the buses 30 and 58 for read operations (e.g., data transfers from the corresponding memory channels 82a-82n to the memory controller 20).

The data buffers 100a-100n may exchange data with the DRAM chips 84a-84n in small units (e.g., 4-bit nibbles). In various embodiments, the DRAM chips 84a-84n may be arranged in multiple (e.g., two) sets. For two set/two DRAM chip (e.g., 84a-84b) implementations, each set may contain a single DRAM chip (e.g., 84a or 84b). Each DRAM chip 84a-84b may be connected to the respective data buffers 100a-100n through an upper nibble and a lower nibble. For two set/four DRAM chip (e.g., 84a-84d) implementations, each set may contain two DRAM chips (e.g., 84a-84b or 83c-84d). A first set may be connected to the respective data buffers 100a-100n through the upper nibble. The other set may be connected to the respective data buffers 100a-100n through the lower nibble. For two set/eight DRAM chip (e.g., 84a-84h) implementations, each set may contain four of the DRAM chips 84a-84h. A set of four DRAM chips (e.g., 84a-84d) may connect to the respective data buffers 100a-100n through the upper nibble. The other set of four DRAM chips (e.g., 84e-84h) may connect to the respective data buffers 100a-100n through the lower nibble. Other numbers of sets, other numbers of DRAM chips, and other data unit sizes may be implemented to meet the design criteria of a particular implementation.

The DDR4 LRDIMM configuration may reduce a number of data loads to improve signal integrity on a data bus (e.g., the bus 30) of the memory module from a maximum of several (e.g., four) data loads down to a single data load. The distributed data buffers 100a-100n may allow DDR4 LRDIMM designs to implement shorter I/O trace lengths compared with DDR3 LRDIMM designs that use a centralized memory buffer. For example, shorter stubs connected to the memory channels 82a-82n may result in less pronounced signal reflections (e.g., improved signal integrity). In another example, the shorter traces may result in a reduction in latency (e.g., approximately 1.2 nanoseconds (ns), that is 50% less latency than DDR3 buffer memory). In yet another example, the shorter traces may reduce I/O bus turnaround time. For example, without the distributed data buffers 100a-100n (e.g., in DDR3 memory applications) traces would be routed to a centrally located memory buffer, increasing trace lengths up to six inches compared with the DDR4 LRDIMM implementation shown in FIG. 2.

In some embodiments, the DDR4 LRDIMM configuration may implement nine of the data buffers 100a-100n. The memory modules 50a-50n may implement 2 millimeter (mm) frontside bus traces and backside traces (e.g., the connectors/pins/traces 60). A propagation delay through the data buffers 100a-100n may be 33% faster than through a DDR3 memory buffer (e.g., resulting in reduced latency). In some embodiments, the data buffers 100a-100n may be smaller (e.g., a reduced area parameter) than a data buffer used for DDR3 applications.

Referring to FIG. 3, a diagram is shown illustrating a data buffer 100i in accordance with an example embodiment of the invention. The data buffer 100i may be representative of an example embodiment of the data buffers 100a-100n. The data buffer 100i is shown having a first input/output 110, a second input/output 111, a third input/output 112, a fourth input/output 114, multiple fifth inputs 116a-116d.

The first input/output 110 is configured for presenting/receiving the signals DQi between the data buffer 100i and the controller 20. The second input/output 111 is configured for presenting/receiving the signals DQSi (e.g., the data strobe signals DQS) between the data buffer 100i and the controller 20. The third input/output 112 is configured for presenting/receiving the signals DQi as memory input/output (MIO) signals (e.g., MDQi) corresponding to a memory channel between the data buffer 100i and the respective memory devices (e.g., DRAM chips) 90a-90n.

The signals MIO are generally transmitted between the DRAM chips 84a-84n and the respective data buffer 100a-100n. In an example, data (e.g., in the signals DQi) from each channel of the memory controller 20 may be presented to the data buffer 100i, buffered in the data buffer 100i, then transmitted to the respective memory channel 82i. For example, the bus 58 may transmit a version of the signal DQi (e.g., the signal MIO) between the data buffers 100a-100n and the corresponding memory channels 82a-82n). In another example, data from the memory channel 82i may be presented to the data buffer 100i, buffered in the data buffer 100i, and then transmitted on an appropriate memory channel to the memory controller 20.

The data buffer 100i is shown also receiving signals (e.g., DBC) from the bus 56 at a control port (e.g., DBC PORT). The signal DBC may be presented to each of the data buffers 100a-100n (e.g., using the data buffer control bus 56). In an example, the signal DBC is illustrated comprising five signals transmitted over 9 pins/bits (e.g., a pair of signals BCK_T/BCK_C, a signal BCOM, a signal BCKE, a signal BODT and/or a signal BVREFCA). However, other numbers of pins/bits may be implemented accordingly to meet the design criteria of a particular application. The control port of the data buffer 100i is shown having the fourth input 114 receiving the signals BCK_T/BCK_C, the fifth input 116a receiving the signal BCOM, input 116b receiving the signal BCKE, input 116c receiving the signal BODT, and input 116d receiving the signal BVREFCA.

In various embodiments, the signals BCK_T/BCK_C may be implemented as a 2-bit signal representing a differential (e.g., true (T) and complementary (C) versions) clock signal for the data buffers 100a-100n. In various embodiments, the signal BCOM may be implemented as a 4-bit signal representing data buffer commands. The signal BCOM may be implemented as a unidirectional signal from the RCD circuit 102 to the data buffers 100a-100n. In an example, the signal BCOM may be implemented at a single data rate (e.g., 1 bit per signal per clock cycle). However, a particular command may take a different number of clock cycles to transfer information. The signal BCKE may be a function registered dedicated non-encoded signal (e.g., DCKE). The signal BODT may be a function registered dedicated non-encoded signals (e.g., DODT). The signal BVREFCA may be a reference voltage for use with pseudo-differential command and control signals.

Each channel of the data buffers 100a-100n may receive a set of data buffer commands (e.g., for writing buffer control words (BCWs) from the signals DBC. The buffer control words may be used to customize operation of the respective channel of the data buffers 100a-100n. The buffer control words may flow from the memory controller 20, through the RCD circuit 102, to the data buffers 100a-100n. The buffer control words may be similar to register control words (RCWs) used for configuring the RCD circuit 102. Similar to commands for writing the register control words, the commands for writing the buffer control words may look like an MRS7 command, where the address lines are really the payload.

In embodiments where the bus 56 comprises nine pins, the RCD circuit 102 may do more than pass a buffer control word directly through to the data buffers 100a-100n. In one example, the RCD circuit 102 may convert (e.g., multiplex)

an MRS7 command format into a buffer control word in a BCOM format. The RCD circuit 102 may map the 12 address bits of the MRS7 command into five separate data transfers, each 4 bits wide. The five data transfers may be set up back to back over the bus 56. For example, 5 clock cycles plus a parity cycle may be used to complete the buffer command in the buffer control word. Once the buffer control word reaches the data buffers 100a-100n, the data buffers 100a-100n may decode the buffer control word, write the buffer control word to a function space of the data buffer, and complete the buffer command in the buffer control word.

A function of the signal BCOM may be to transmit the buffer control words. However, compliant with the JEDEC specification for DDR4 SDRAM, the RCD circuit 102 may send all read/write commands and MRS information over the bus 56 (e.g., to allow the data buffers 100a-100n to keep track of what the DRAM chips 84a-84n are doing). In some embodiments, different buffer commands may take a different number of cycles to transfer the information.

The RCD circuit 102 may receive an MRS7 command from the memory controller 20 (e.g., from a host). For example, a host may want to change a parameter (e.g., typically on boot up of a computing device). The RCD circuit 102 may check the MRS7 command to determine whether the address bit 12 is set to 1 (e.g., a logical one). In an example, when an address bit 12 of the MRS7 command is set to 1, the RCD circuit 102 may recognize the command as a buffer command (e.g., a command that is not meant for the RCD circuit 102). The RCD circuit 102 may convert the command from the memory controller 20 to a buffer control word and send the buffer control word to the data buffers 100a-100n via the bus 56. The data buffers 100a-100n may write the buffer control word to a function space to complete the command.

The data buffers 100a-100n may be configurable. The buffer commands may allow the memory controller 20 to customize aspects of termination (e.g., ODT), signal strength on the DQ lines, and/or events (e.g., receiver timing, driver timing, etc.) in both directions (e.g., for both read and write operations). In some embodiments, some of the configurations of the data buffers 100a-100n may be decided based on system level configurations. Generally, most of the configuration of the data buffers 100a-100n may be decided during training steps. During training steps, host controllers (e.g., the memory controller 20) may test and compare results of various training steps to determine an optimal configuration.

In various embodiments, the bus 56 may be used to send commands/data to program configuration registers of the data buffers 100a-100n. The bus 56 may also send commands (e.g., data reads and/or data writes) that control data traffic through the data buffers 100a-100n. For example, some commands may optimize power consumption of the data buffers 100a-100n. In another example, read/write delays may be added per data line.

The data buffers 100a-100n may implement dual multi-bit (e.g., 4-bit) bidirectional data registers with differential data strobes (e.g., DQS_T/DQS_C). The data buffers 100a-100n may implement automatic impedance calibration. The data buffers 100a-100n may implement BCOM parity checking. The data buffers 100a-100n may implement control register (e.g., buffer control word) readback.

Referring to FIG. 4, a diagram is shown of an example implementation of a circuit (or apparatus) 100 is shown in accordance with an embodiment of the invention. In various embodiments, the circuit 100 may be instantiated in each data buffer circuit 100a-100n (a single data buffer 100i is shown as an example) that connects the connectors/pins/traces 60 to the DRAM chips 84a-84n. The circuit 100 generally comprises a block (or circuit) 120 and a block (or circuit) 122. The circuit 122 generally comprises a block (or circuit) 124 and a block (or circuit) 126.

The bus 56 may be connected to the circuit 120. The signals DQi and DQSi may be received on line 30 (e.g., across a backplane) at the inputs 110 and 111, respectively. The signal DQSi may convey strobe information used to identify when data in the signal DQi is valid. In some embodiments, the signal DQSi may be viewed as a non-consecutive clock. The signal DQSi may be received by the circuits 120, 122 and 124. The signal DQi may be received by the circuits 122 and 124. A signal (e.g., CTRL) may be generated by the circuit 120 and presented to the circuit 124. The signal CTRL may implement a control signal. A signal (e.g., INTERNAL_CLK) may be received by the circuit 120. In some embodiments, the signal INTERNAL_CLK may be the clock signal CLK' (or the clock Y_CLK) generated by the RCD circuit 102. In various embodiments, the signal INTERNAL_CLK may implement a clock internal to the circuit 100i. In some embodiments, the signal INTERNAL_CLK may be derived from the bus 30 (e.g., generated based on the signal DQSi). Other sources of the signal INTERNAL_CLK may be implemented to meet the criteria of a particular application. A signal (e.g., V_OUT) may be generated by the circuit 124 and presented to the circuit 126. The signal V_OUT may convey an output voltage representative of the data received in the signal DQi. The circuit 126 may generate the memory input/output signal MIO on the bus 58.

The circuit 120 is shown implementing a command sequence detector circuit. The command sequence detector circuit 120 is generally operational to detect sequences of continuous and non-continuous commands in the signal BCOM on the bus 56. When a new command (e.g., a write command) is detected in the signal BCOM, the command sequence detector circuit 120 may monitor the strobe information in the signal DQSi for a preamble. When the preamble is detected, the command sequence detector circuit 120 may generate control information in the signal CTRL based on the signal INTERNAL_CLK. The control information may instruct the circuit 122 how to properly recover the data in the signal DQi. An example application of the command sequence detector circuit 120 may be found in co-pending U.S. application Ser. No. 15/367,742, filed Dec. 2, 2016, which relates to U.S. Provisional Application No. 62/263,567, filed Dec. 4, 2015, and U.S. Provisional Application No. 62/372,396, filed Aug. 9, 2016, each of which are hereby incorporated by reference in their entirety.

The circuit 122 may implement a receiver circuit. The receiver circuit 122 is generally operational to receive the data in the signal DQi based on the strobe in the signal DQSi, the control information in the signal CTRL, and the signal INTERNAL_CLK. The received data may be equalized and conditioned in the receiver circuit 122. The conditioned data may be presented by the receiver circuit 122 in the signal MIO.

The circuit 124 is shown implementing a feedback equalizer circuit. The feedback equalizer circuit 124 is generally operational to cancel the crosstalk experienced by the received data in the signal DQi due to the strobe information in the signal DQSi. The cancellation is generally based on the control information received in the signal CTRL. In various embodiments, timing of the crosstalk cancellation may be based on the strobe information received in the signal DQSi. In other embodiments, timing of the crosstalk cancellation may be based on the signal INTERNAL_CLK. The feedback equalizer circuit 124 may adjust a tap contribution to the signal MIO generated by the circuit 126 based on the signal CTRL. The resulting data may be presented by the feedback equalizer circuit 124 in the signal V_OUT to the circuit 126.

The circuit 126 may implement a conditioner circuit. The conditioner circuit 126 may be operational to condition the equalized data received in the signal V_OUT. The conditioning may include, but is not limited to, decision feedback equalization (DFE), and/or a linear equalizer circuit. The conditioned data may be presented in the signal MIO to the targeted data paths 80a-80n.

Figure 5:
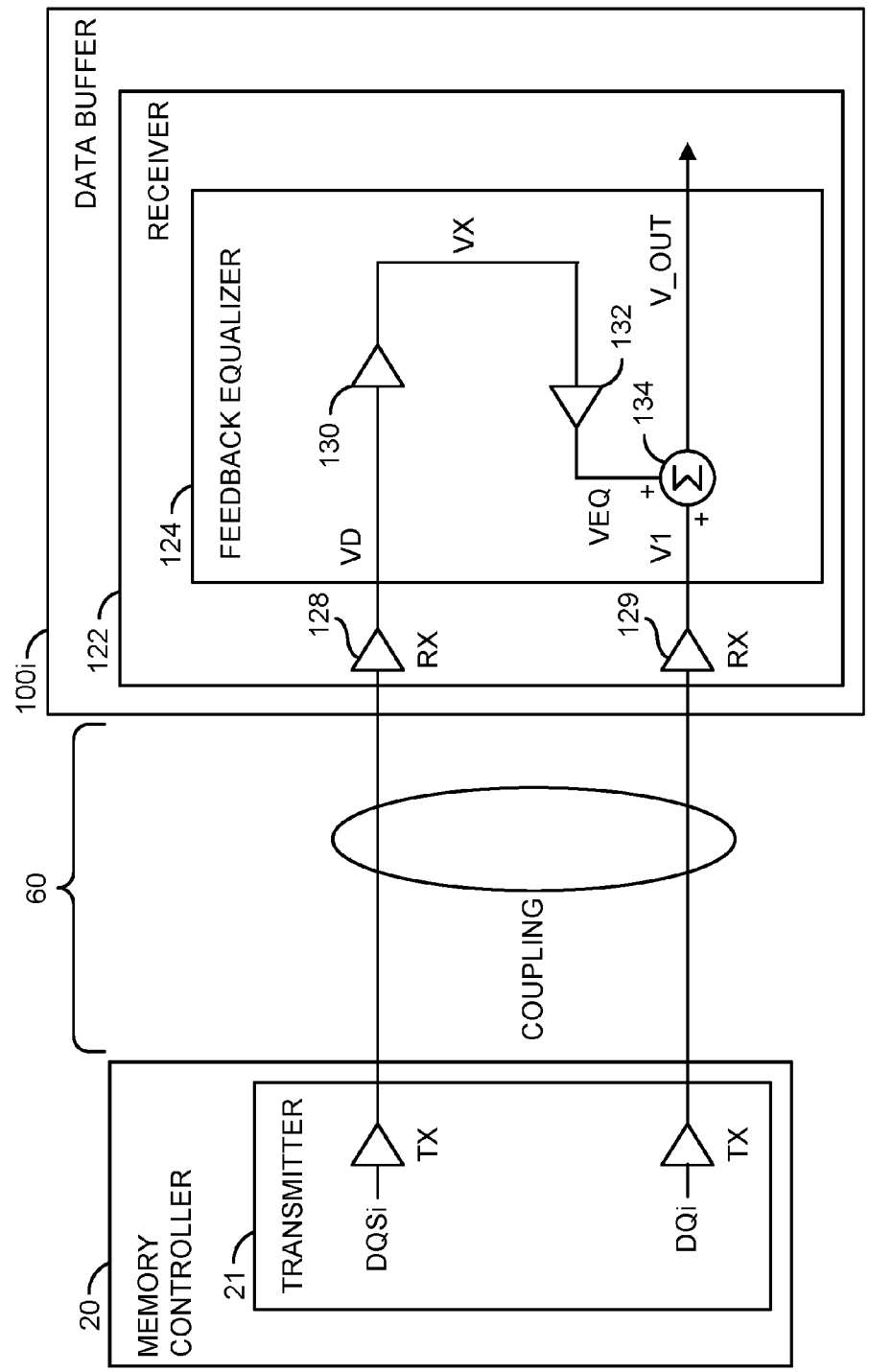
FIG. 5 is a block diagram of a receiver circuit and a memory controller circuit.

Referring to FIG. 5, a block diagram of an example implementation of the receiver circuit 122 and the memory controller 20 is shown. The receiver circuit 122 generally comprises the feedback equalizer circuit 124, a block (or circuit) 128 and a block (or circuit) 129. The feedback equalizer circuit 124 of the receiver circuit 122 generally comprises a block (or circuit) 130, a block (or circuit) 132 and a block (or circuit) 134. The memory controller 20 generally comprises a block (or circuit) 21.

The signal DQSi may be generated by the circuit 21 and transferred through the connectors/pins/traces 60 to the circuit 128. The signal DQi may be generated by the circuit 21 and transferred through the connectors/pins/traces 60 to the circuit 129. Parasitic coupling (e.g., inductive parasitics, capacitive parasitics and/or resistive parasitics) between the signal DQSi and the signal DQi may result in the deterministic crosstalk noise that corrupts the data in the signal DQi.

The circuit 128 may generate a signal (e.g., VD) received at the circuit 130. The signal VD may convey a received version of the strobe information in the signal DQSi. The circuit 129 may generate a signal (e.g., V1) received by the circuit 134. The signal V1 may carry a received version of the data with the crosstalk. A signal (e.g., VX) may be generated by the circuit 130 and presented to the circuit 132. The intermediate signal VX may provide a delayed version of the strobe information carried in the signal VD. The circuit 132 may generate a signal (e.g., VEQ) received by the circuit 134. The signal VEQ may carry equalization information. The equalization information may be designed to offset the crosstalk coupled from the signal DQSi to the signal DQi. The circuit 134 may generate the signal V_OUT.

The circuit 21 is shown as a transmitter circuit. The transmitter 21 is generally operational to amplify and/or shape the data in the signal DQi and the strobe information in the signal DQSi. The transmitter 21 may transfer the data and strobe information to the memory modules 50a-50n via the connectors/pins/traces 60.

The circuits 128 and 129 are shown implementing receiver buffer circuits. The receiver buffer 128 is generally operational to receive the strobe information in the signal DQSi. The received strobe information may be presented to the feedback equalizer circuit 124 in the signal VD. The receiver buffer 129 is generally operational to receive the data in the signal DQi. The received data may be presented to the feedback equalizer circuit 124 in the signal V1. In various embodiments, a delay through the receiver buffer 129 may be longer than a delay through the receiver buffer 128. In some embodiments, the delay through the receiver buffer 129 may match a combined delay through the receiver buffer 128, plus a delay through the circuit 130, plus a delay through the circuit 132 to keep the strobe information in the signal DQSi in synchronization with the data in the signal DQi at input ports to the circuit 134.

The circuit 130 may implement a delay circuit. The circuit 130 is generally operational to generate the signal VX as a delayed version of the signal VD. In various embodiments, the delay circuit 130 may provide a non-inverting and unity gain operation.

The circuit 132 may implement a buffer circuit. The buffer circuit 132 may be operational to generate the signal VEQ as an amplitude reduced and inverted version of the signal VX. A propagation delay of the data strobe information through the receiver circuit 128, the delay circuit 130 and the buffer circuit 132 generally matches a delay of the data in the signal DQi through the receiver buffer 129.

The circuit 134 is shown implemented as a summation circuit. The summation circuit 134 is generally operational to generate the signal V_OUT by adding the signals V1 and VEQ. The addition of the inverse waveform from the signal VEQ to the crosstalk-corrupted data in the signal V1 generally offsets the data eyes in the signal V_OUT. The offset added to the data generally shifts the data-eyes in a correct direction and thus improves receiver performance.

Figure 6:
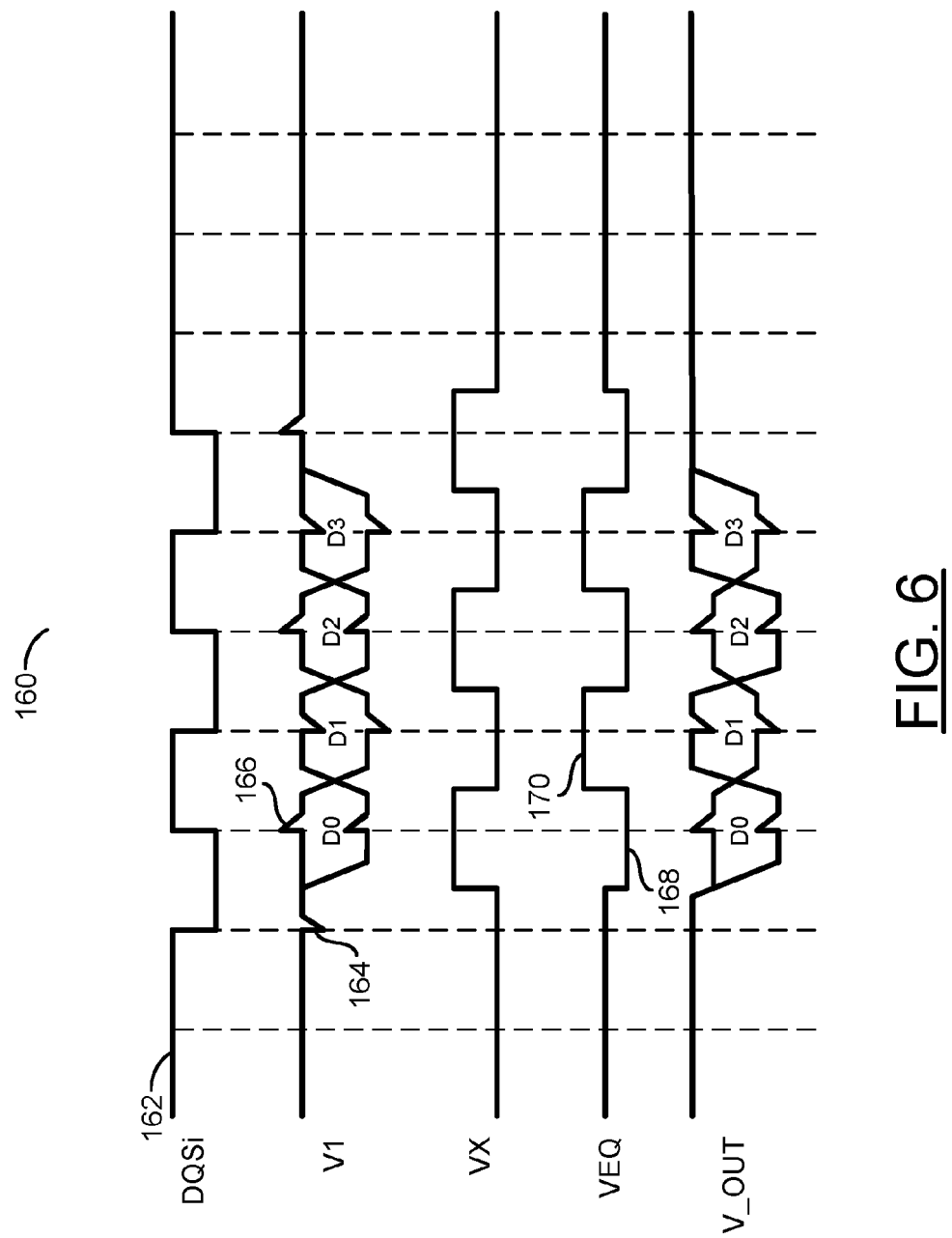
FIG. 6 is a set of waveforms corresponding to FIG. 5.

Referring to FIG. 6, a set of waveforms 160 is shown. The waveforms 160 may be used in and generated by the transmitter 21 and the receiver circuit 122. Reception of write data generally begins with the reception of a preamble 162 in the signal DQSi a programmable time after a write command has been received by the data buffer 100i via the bus 56. Each falling strobe edge in the signal DQSi generally induces a negative spike (or pulse) 164 in the signals DQi and V1. Each rising strobe edge in the signal DQSi may induce a positive spike (or pulse) 166 in the signals DQi and V1. By way of example, the waveforms 160 show a burst chop (e.g., four data bits D0 to D3). The positive spikes 166 and negative spikes 164 induced by the signal DQSi may be present in the signal V1 while the data bits D0 to D3 are considered valid due to the edges in the strobe information.

The signal VX may be generated by the delay circuit 130 in response to the signal VD, which is generated by the receive buffer 128 in response to the signal DQSi. The signal VX may provide a high level for each low level in the signal DQSi. The signal VX may provide a low level for each high level in the signal DQSi. The buffer circuit 132 may invert and reduce each high level in the signal VX to generate a corresponding low level 168 in the signal VEQ. Likewise, the buffer circuit 132 may adjust and invert each low level in the signal VX to generate a corresponding high level 170 in the signal VEQ. The low levels 168 and the high levels 170 in the signal VEQ may be timed to align with the data the signal V1, respectively. When the signal V1 and VEQ are added by the summation circuit 134, the crosstalk spikes created in the data may be offset by the levels in the signal VEQ. In the example, the data eyes for bits D0 and D2 may be offset downward by the low levels 168 and the data eyes for bits D1 and D3 may be offset upward by the high levels 170. As a result, the tops of the upper crosstalk-induces spikes in the data eyes of bits D0 and D2 may align in voltage with the tops of the data eyes of bits D1 and D3. The bottom of the bottom crosstalk-induced spikes in the data eyes of bits D1 and D3 may align in voltage with the bottoms of the data eyes of bits D0 and D2.

By synchronizing and offsetting the data bits in the signal VX to the strobe edges in the signal DQSi, the crosstalk-induced spikes in the signal V_OUT may be effectively neutralized for the conditioner 106 to handle. The bottom crosstalk-induced spikes in the data eyes of bits D0 and D2 (e.g., the spikes pointing up) may not cause the conditioner 106 to improperly treat low-value data bits D0 or D2 as high data values. The top crosstalk-induced spikes in the data eyes of bits D1 and D3 (e.g., the spikes pointing down) may not cause the conditioner 106 to improperly treat high-value data bits D1 and D3 as low data values.

Figure 7:
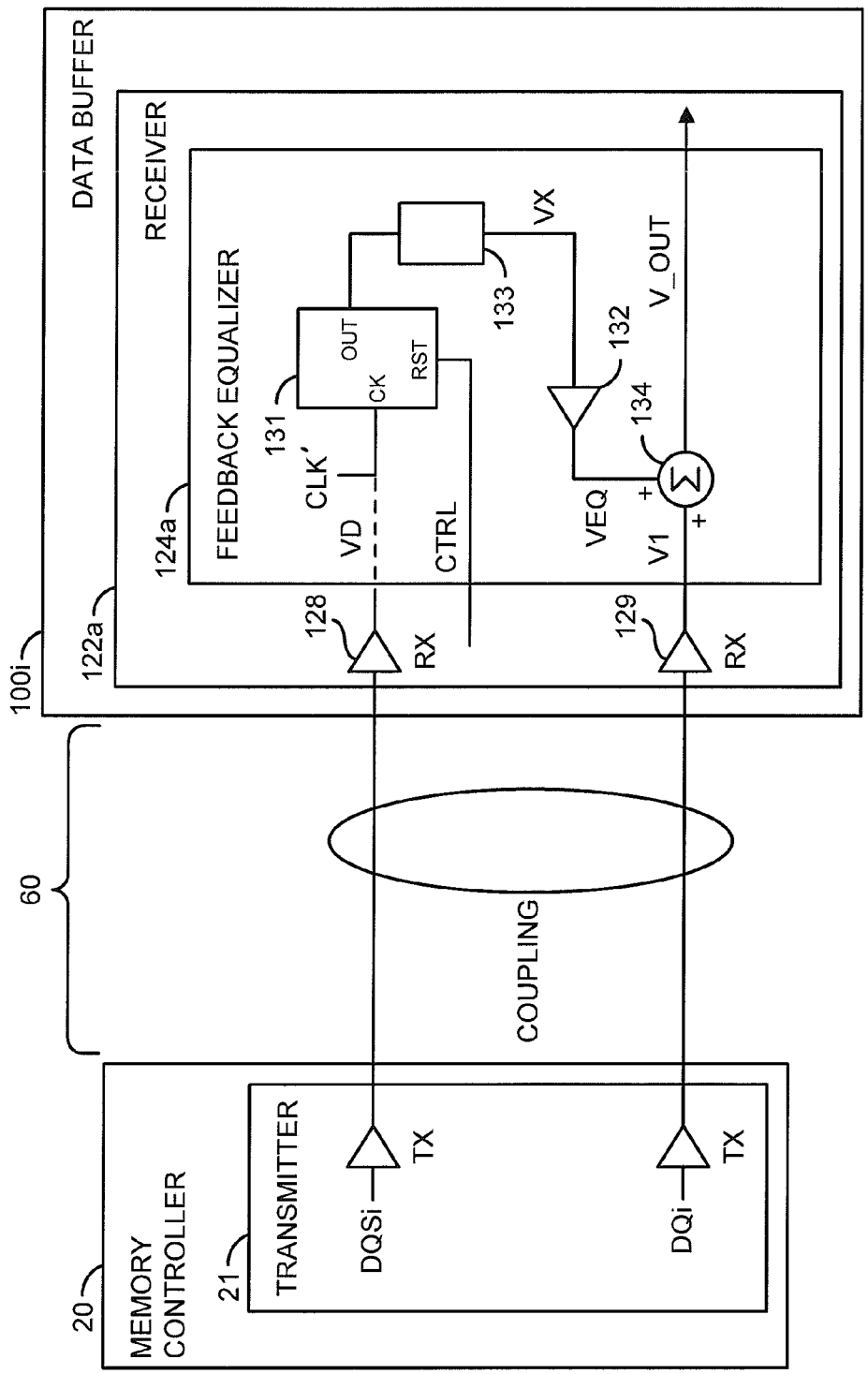
FIG. 7 is a block diagram of another receiver circuit and the memory controller.

Referring to FIG. 7, a block diagram of another example implementation of a receiver circuit 122a and the memory controller 20 is shown. The receiver circuit 122a may be a variation of the receiver circuit 122. The receiver circuit 122a generally comprises a feedback equalizer circuit 124a, the receiver buffer 128 and the receiver buffer 129. The feedback equalizer circuit 124a of the receiver circuit 122a generally comprises a block (or circuit) 131, and optional block (or circuit) 133, the buffer circuit 132 and the summation circuit 134.

In various embodiments, the signal CLK' may be received at the clock input port (CK) of the circuit 131. In some embodiments, the signal INTERNAL_CLK may be received at the clock input port of the circuit 131 in place of the signal CLK'. The signal CTRL may be received at the reset input port (RST) of the circuit 131. The signal VX may be generated at an output port (OUT) of the circuit 131.

In some embodiments, the circuit 131 may implement a synchronizer circuit. The synchronizer 131 may be operational to synchronize the intermediate (or synchronization) signal VX to the clock signal CLK' (or the signal INTERNAL_CLK). The synchronization may be reset by assertion of the signal CTRL. In various embodiments, the resulting signal VX may be 180 degrees out of phase with the signal CLK'. Each rising edge of the signal CLK' may correspond to a falling edge in the signal VX. Each falling edge of the signal CLK' may correspond to a rising edge in the signal VX.

In other embodiments, the circuit 131 may implement a dual edge counter circuit. The counter 131 may be operational to detect each rising edge and each falling edge of the strobe information received in the signal VD at the clock input port CK. In some embodiments, the counter 131 may be implemented as a short (e.g., one bit) counter. As a one-bit counter, the counter 131 may toggle between a logical zero and a logical one for each rising edge and each falling edge seen in the strobe information in the signal VD. The count may be reset (e.g., set to the logical zero condition) by assertion of the signal CTRL at a reset input port (RST). In various embodiments, a rising edge in the signal VX generally indicates a coupling of a falling (or negative) edge in the strobe information to the data in the signal DQi. A falling edge in the signal VX may indicate a coupling of a rising (or positive) edge in the strobe information to the data in the signal DQi. The counter 131 may present the signal VX at a count output port (CNT).

The optional circuit 133 may implement a filter circuit. The filter circuit 133 may be operational to generate a waveform in the signal VX that mimics the crosstalk imposed by the strobe information in the signal DQSi on the data in the signal DQi. In some embodiments, the filter circuit 133 may implement an infinite-impulse response (IIR) filter circuit. The filter circuit 133 may generate a different (e.g., opposite) spike in the signal VX based on a logical zero to logical one transitions in the count signal received from the circuit 131. For example, a falling edge in the count signal may result in a negative-going spike in the signal VX while a rising edge in the count signal results in a positive-going spike in the signal VX.

The buffer circuit 132 may adjust an amplitude of the voltage in the signal VX to generate the signal VEQ. In such embodiments, the buffer circuit 132 may be a non-inverting buffer. Where the filter circuit 133 is not implemented, the high levels and the low levels received by the buffer circuit 132 in the signal VX may result in smaller-amplitude level in the signal VEQ. Where the filter circuit 133 is implemented, the positive spikes and the negative spikes in the signal VX may result in smaller-amplitude spikes in the signal VEQ.

Referring to FIG. 8, another set of waveforms 180 is shown. The waveforms 180 may be used in and generated by the transmitter 21 and the receiver circuit 122a. Reception of write data generally begins with the reception of the preamble 162 in the signal DQSi a programmable time after a write command has been received by the data buffer 100i via the DBS bus 56. Each falling strobe edge in the signal DQSi generally induce the negative spike (or pulse) 164 in the signals DQi and V1. Each rising strobe edge in the signal DQSi may induce the positive spike (or pulse) 166 in the signals DQi and V1. By way of example, the waveforms 180 show the burst chop (e.g., four data bits D0 to D3). The positive spikes 166 and the negative spikes 164 induced by the signal DQSi may be present while the data bits D0 to D3 are considered valid due to the edges in the strobe information.

The synchronization signal VX may be generated by the circuit 131 in synchronization with the signal CLK'. The signal VX may provide a rising synchronization edge for each falling clock edge in the signal CLK'. The signal VX may provide a falling synchronization edge for each rising clock edge in the signal CLK'. The optional filter circuit 133 may convert the rising edges into positive spikes 169 and convert the falling edges into negative spikes 171 in the signal VX.

The buffer circuit 132 may adjust the voltages in the signal VX to generate the signal VEQ. Where the filter circuit 133 is not implemented, the buffer circuit 132 may adjust the high levels in the signal VX into smaller-amplitude high levels 177 in the signal VEQ. Likewise, the buffer circuit 132 may adjust the low levels in the signal VX into smaller-amplitude low levels 179 in the signal VEQ.

Where the filter circuit 133 is implemented, the buffer circuit 132 may adjust the positive spikes 169 in the signal VX into lower-amplitude positive spikes 173 in the signal VEQ. The buffer circuit 132 may also adjust the negative spikes 171 in the signal VX into lower-amplitude negative spikes 175 in the signal VEQ. The positive spikes 173 and the negative spikes 175 in the signal VEQ may be timed to align with the negative spikes 164 and the positive spikes 166 in the signal V1. When the signals V1 and VEQ are added by the summation circuit 134, the crosstalk spikes created by in the data may be partially to fully cancelled by spikes in the signal VEQ. The spikes 173 and 175 generated by the by the filter circuit 133 may appear as respective spikes 182 and 184 in the signal V_OUT during bit times other than when the data bits D0 to D3 are present. By synchronizing the bursts in the signal VX to the clock edges in the signal CLK' (that are synchronized to the strobe edges in the signal DQSi), the signal V_OUT may have little or no crosstalk spikes for the conditioner 106 to handle while the data bits D0 to D3 are valid. The removal of the crosstalk from the data bits generally shifts the data-eyes in a correct direction and thus improves receiver performance. The conditioner 106 may ignore the spikes 182 and 184 present in the signal V_OUT that are outside the bit times of the valid data D0 to D3.

While FIGS. 4 and 7 generally shows the command sequence detector circuit 120 and the receiver circuits 122/122a in the context of the data buffer circuit 100i while receiving information, copies of the command sequence detector circuit 120 and the receiver circuits 122/122a may be implemented at other locations, other data paths and/or other control paths (e.g., paths that use DDR-type signaling). In some embodiments, copies of the command sequence detector circuit 120 and the receiver circuits 122/122a may be located in the RCD circuit 102 to improve the signals received from the memory controller 20. In various embodiments, copies of the command sequence detector circuit 120 and the receiver circuits 122/122a may be located at the other end of the data bus 30 (e.g., the other end of a backplane) to improve various signals generated by the memory modules 50a-50n and received by the memory controller 20. For example, the memory controller 20 may include copies of the command sequence detector circuit 120 and the receiver circuits 122/122a to read data sent in the signals DQa-DQn from the memory modules 50a-50n during a read cycle. The read commands may be transferred to a memory controller-based command sequence detector circuit 120 via another bus besides the bus 56. Instances of the command sequence detector circuit 120 and the receiver circuits 122/122a may also be implemented in other circuitry within the memory modules 50a-50n.

Although embodiments of the invention have been described in the context of a DDR4 application, the present invention is not limited to DDR4 applications, but may also be applied in other high data rate digital communication applications where different transmission line effects, cross-coupling effects, traveling wave distortions, phase changes, impedance mismatches and/or line imbalances may exist. The present invention addresses concerns related to high speed communications, flexible clocking structures, specified command sets and lossy transmission lines. Future generations of DDR can be expected to provide increasing speed, more flexibility, additional commands and different propagation characteristics. The present invention may also be applicable to memory systems implemented in compliance with either existing (legacy) memory specifications or future (e.g., DDR5) memory specifications.

The functions and structures illustrated in the diagrams of FIGS. 1 to 8 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
a detector circuit configured to (i) identify a start of a command sequence associated with a write access to a memory system and (ii) generate a control signal indicating a start of a plurality of strobe edges in a strobe signal associated with said start of said command sequence; and
a receiver circuit configured to initialize an equalizer circuit in response to said control signal, wherein said equalizer circuit is configured to compensate for crosstalk coupled from said strobe edges in said strobe signal on a data strobe line to a data signal on a data line to provide an increased margin.

2. The apparatus according to claim 1, wherein said equalizer circuit is configured to adjust an amplitude of an output signal of said receiver circuit based on said strobe edges in said strobe signal on said data strobe line.

3. The apparatus according to claim 1, wherein said detector circuit and said receiver circuit form a data buffer circuit configured to couple said memory system to a backplane.

4. The apparatus according to claim 3, wherein said data buffer circuit is double data rate fourth generation (DDR4) compliant.

5. The apparatus according to claim 1, wherein said equalizer circuit comprises a counter circuit configured to generate a count signal that has a plurality of count edges that correspond to said strobe edges in said strobe signal received on said data strobe line.

6. The apparatus according to claim 1, wherein (i) said equalizer circuit comprises a synchronization circuit configured to generate a synchronization signal that has a plurality of synchronization edges that correspond to a plurality of clock edges of a clock signal and (ii) said clock edges of said clock signal are aligned in time to said strobe edges in said strobe signal.

7. The apparatus according to claim 1, wherein said equalizer circuit is configured to generate an intermediate signal having a plurality of intermediate edges timed with said crosstalk imposed on said data signal in said data line by said strobe signal in said data strobe line.

8. The apparatus according to claim 7, wherein (i) said equalizer circuit further comprises a coefficient circuit configured to generate an equalization signal having a plurality of bursts in response to said intermediate edges in said intermediate signal and (ii) said bursts mimic said crosstalk.

9. The apparatus according to claim 8, wherein said equalizer circuit further comprises a summation circuit configured to cancel said crosstalk from said data signal by feedback of said bursts into said data signal.

10. The apparatus according to claim 1, wherein said detector circuit and said receiver circuit are part of a dual in-line memory module (DIMM).

11. The apparatus according to claim 10, wherein said DIMM is double data rate fourth generation (DDR4) compliant.

12. A method for compensation of crosstalk in a memory system, comprising the steps of:
identifying a start of a command sequence associated with a write access to said memory system;
generating a control signal indicating a start of a plurality of strobe edges in a strobe signal associated with said start of said command sequence; and
initializing an equalizer circuit in response to said control signal; and
compensating for said crosstalk coupled from said strobe signal on a data strobe line to a data signal on a data line to provide an increased margin.

13. The method according to claim 12, further comprising the step of:
adjusting an amplitude of an output signal based on corresponding edges of said strobe edges in said strobe signal on said data strobe line.

14. The method according to claim 12, wherein the steps are performed in a data buffer circuit configured to couple said memory system to a backplane.

15. The method according to claim 14, wherein said data buffer circuit is double data rate fourth generation (DDR4) compliant.

16. The method according to claim 12, further comprising the step of:
generating a count signal that has a plurality of count edges that correspond to said strobe edges in said strobe signal received on said data strobe line.

17. The method according to claim 12, further comprising the step of:
generating a synchronization signal that has a plurality of synchronization edges that correspond to a plurality of clock edges of a clock signal, wherein said clock edges of said clock signal are aligned in time to said strobe edges in said strobe signal.

18. The method according to claim 12, further comprising the step of:
generating an intermediate signal having a plurality of intermediate edges timed with said crosstalk imposed on said data signal in said data line by said strobe signal in said data strobe line.

19. The method according to claim 18, further comprising the step of:
generating an equalization signal having a plurality of bursts in response to said intermediate edges in said intermediate signal, wherein said bursts mimic said crosstalk.

20. The method according to claim 19, further comprising the step of:
cancelling said crosstalk from said data signal by feedback of said bursts into said data signal.

* * * * *